United States Patent [19]

Choi

[11] Patent Number: 5,062,082
[45] Date of Patent: Oct. 29, 1991

[54] SEMICONDUCTOR MEMORY DEVICE WITH DELAY IN ADDRESS PREDECODER CIRCUIT INDEPENDENT FROM ATD

[75] Inventor: Yun-ho Choi, Incheon, Rep. of Korea

[73] Assignee: Samsung Electronics Co., Ltd., Kyungg-do, Rep. of Korea

[21] Appl. No.: 642,746

[22] Filed: Jan. 18, 1991

[30] Foreign Application Priority Data

Sep. 4, 1990 [KR] Rep. of Korea .................. 90-13926

[51] Int. Cl.⁵ ............................................... G11C 8/00
[52] U.S. Cl. ................................ 365/230.06; 365/194; 365/203; 365/233.5; 307/449; 307/591; 307/594
[58] Field of Search .................. 307/449, 591, 594; 365/230.06, 230.08, 233, 233.5, 203, 194

[56] References Cited

U.S. PATENT DOCUMENTS

| | | | |
|---|---|---|---|
| 4,628,488 | 12/1986 | Saku et al. | 365/233 |
| 4,800,304 | 1/1989 | Takeuchi | 365/194 |
| 4,931,998 | 6/1990 | Ootani et al. | 365/230.06 |
| 4,987,560 | 1/1991 | Hamano et al. | 365/230.06 |
| 4,989,182 | 1/1991 | Mochizuki et al. | 365/233 |

Primary Examiner—Joseph E. Clawson, Jr.
Attorney, Agent, or Firm—Rothwell, Figg, Ernst & Kurz

[57] ABSTRACT

A semiconductor memory device includes an address transition detection circuit for detecting the state transition of address signals and generating a pulse having a predetermined pulse width, a precharge circuit for generating and equalizing a pair of input/output lines in response to the output pulse of the address transition detection circuit, address decoder circuit for decoding the address signals and generating an address selection signal, and a gate circuit connecting the pair of input/output lines to a selected pair of bit lines in response to the address selection signal of the address decoder circuit. In the device, the address decoder circuit has a signal delay characteristic for delaying signals from the state transition of the address signal until the completion of the precharge and equalization of the I/O lines. Accordingly, the access time of the memory address can be operated in high speed by forming the address decoder independent of an ATD pulse, and the circuit can be easily designed and the cost can be saved by eliminating the wiring between the ATD circuit and the address decoder.

5 Claims, 6 Drawing Sheets

SEMICONDUCTOR MEMORY DEVICE WITH DELAY IN ADDRESS PREDECODER CIRCUIT INDEPENDENT FROM ATD

FIELD OF THE INVENTION

The present invention relates to a semiconductor memory device, and particularly to a device capable of high speed memory access operation.

BACKGROUND OF THE INVENTION

Along with the tendency of higher density and higher speed of semiconductor devices, some measures have been suggested to cope with the delay of access time due to the increase of capacity. For example, in an address buffer and decoder circuit, the number of memory gates to be driven and the parasitic capacitance are increased with an increase of memory capacity and the increase of the number of divided memory arrays. Therefore, high operation speed from the address buffer to the decoder is achieved by adoption of an address predecoder circuit and by suppressing of the parasitic capacitance. The address predecoder circuit ensures high speed performance by using predecoder signals for the input of the decoder and reducing the input capacity.

In a conventional semiconductor memory device adopting the predecoder circuit, an address transition detection (ATD) pulse is supplied to an I/O line precharge circuit to precharge the input 1 output lines during the ATD pulse time period, and sets the predecoder to be enabled upon ending of the ATD pulse, because a pair of input 1 output lines are to be fully precharged and equalized prior to transferring a pair of data bits to the pair of input and output lines, in order to accurately and swiftly transfer a pair of data bits without any errors. The predecoder is simultaneously enabled with the end of the ATD pulse to combine the outputs of the address buffer, and the combined outputs are finally combined by a main decoder, so that an input/output gate is selected to perform the data transmission. The ATD pulse is fed and precharged to the precharge circuit of the input and output lines before the ATD pulse is ended, then the predecoder waits until the ATD pulse is ended. Thereafter, the predecoder is enabled to combine the output of the address buffer, and the input/output gate is finally selected by the main decoder.

As a result, the whole access time of the column address is represented by the sum of the holding time of the ATD pulse and the decoding times of the predecoder and the main decoder. Accordingly, the access time of the column address is delayed as much as the holding time of the ATD pulse. It is possible to shorten the width of the ATD pulse in order to reduce the access time of the column address, but such has practical limitations. In other words, the ATD circuit is serving as a means for detecting the rising edge of the address signal and generates a pulse having a delayed time width by exclusively oring the original address signal and the delayed address signal, so that it is difficult to shorten the width of the pulse less than 10 ns due to the circuit requirements.

SUMMARY OF THE INVENTION

It is an object of the present invention to provide a high speed semiconductor memory device capable of reducing the access time of the column address by adopting a column decoder having a predetermined delay characteristic independent of an ATD pulse, to solve the above described problems of the conventional device.

It is another object of the present invention to provide a semiconductor memory device the circuit of which is easily designed and the manufacturing cost of which can be reduced by removing wiring between the ATD circuit and the column decoder.

To achieve these and other objects, the semiconductor memory device according to the present invention comprises: address transition detection means for detecting the state transition of address signals and generating a pulse having a predetermined pulse width; precharge means for precharging and equalizing a pair of input/output lines in response to the output pulse of the address transition detection means; column decoder means for decoding the address signals and generating a column selecting signal; and gate means for connecting the selected pair of input/output lines to a pair of bit lines in response to the column selecting signal of the column decoder means; wherein the column decoder means has signal delay characteristics for delaying signals from the state transition of the address signals to the completion of the precharge and equalization of the input 1 output lines.

Therefore, the decoding is performed independently of the ATD pulse by endowing predetermined signal delay characteristics to the column decoder means, so that the semiconductor memory device of the present invention has the advantages that the access time of the column address can be shortened and the wiring between the ATD circuit and the column decoder means can be removed.

BRIEF DESCRIPTION OF THE DRAWINGS

The present invention now will be described by way of an embodiment with reference to the attached drawings, in which.

DETAILED DESCRIPTION OF THE INVENTION

A column address circuit of a conventional semiconductor memory device will be described in detail with reference to FIGS. 1 and 2 in order to further the understanding of the present invention.

Figure 1:
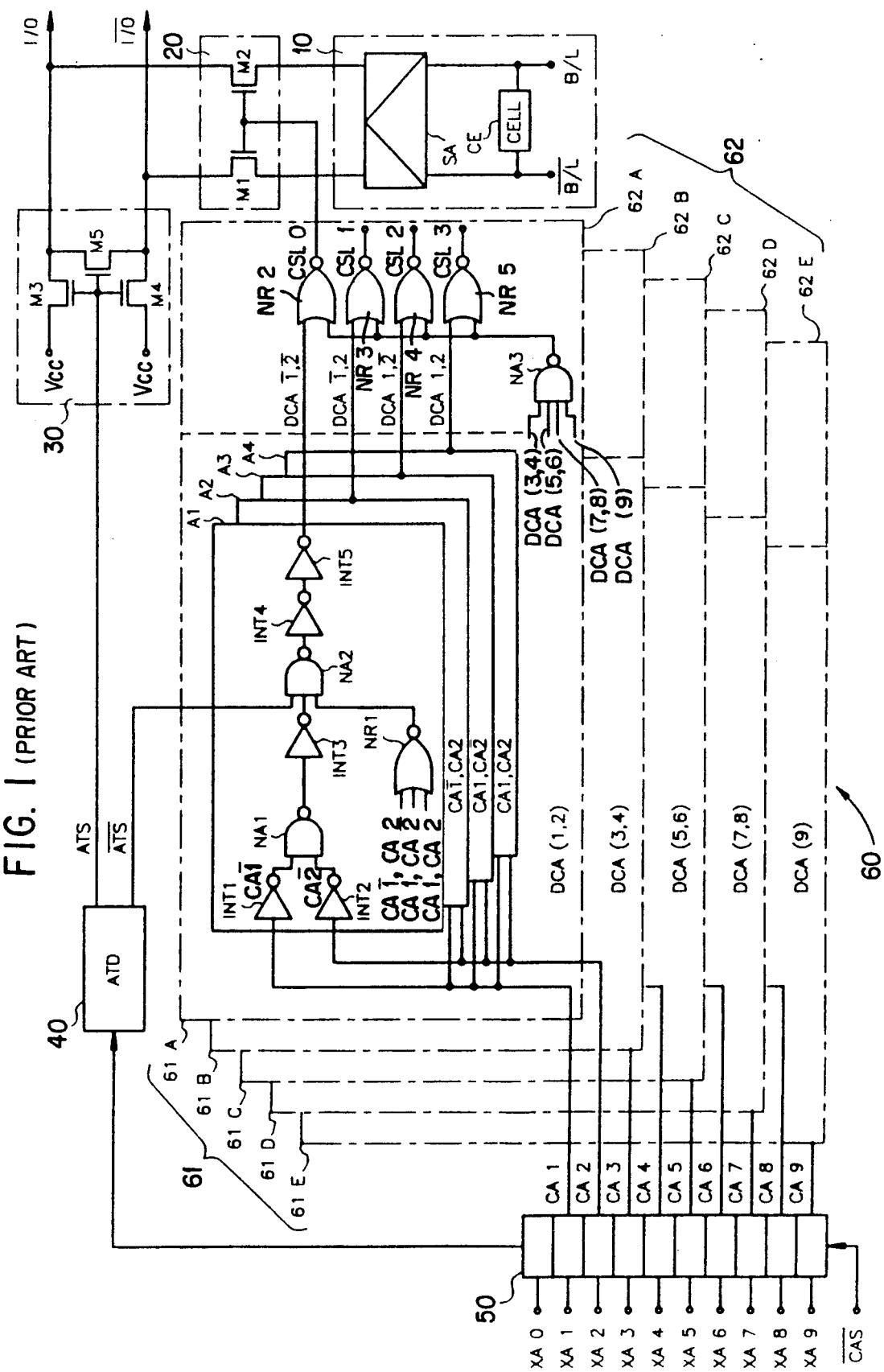
FIG. 1 is a circuit diagram of a column address circuit of a conventional semiconductor memory device.
Figure 2:
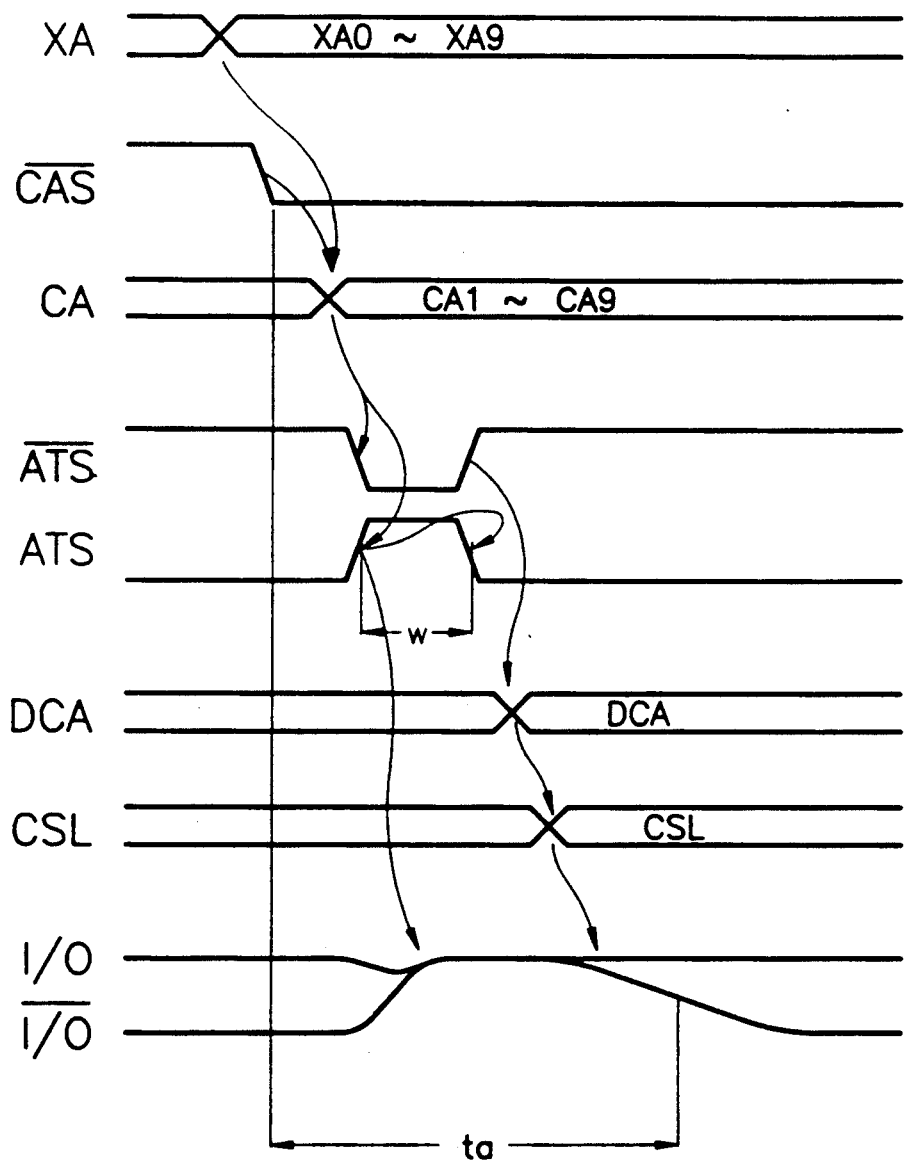
FIG. 2 is a timing chart for explaining the operation of the device shown in FIG. 1.

In FIG. 1, a conventional semiconductor device, for example, a DRAM device comprises a plurality of memory cell arrays 10. Each memory cell array 10 has a plurality of memory cells CE and at least one or more sense amplifiers SA between a pair of bit lines B/L and B/L. The pair of bit lines B/L and B/L are connected to a pair of input/output lines I/O and I/O via an input/output gate circuit 20. Thus, if a word line (not shown)

is selected by a row address signal and the input/output gate circuit 20 is selected by a column address signal, memory cell CE is selected to make it possible to write in or read out data from the memory cell via the pair of input/output lines I/O and I/O. As the pair of input/output lines I/O and I/O functions as a common data bus for all the memory cells of the memory cell array, the increase density results in the an increased of load capacity, thereby reducing the operation speed of the device. Therefore, the pair of input/output lines I/O and I/O is provided with a precharge circuit 30 to precharge the input/output lines before the input/output gate circuit 20 is activated, so as to equalize the voltage level between the pair of input/output lines I/O and I/O. The precharge circuit 30 consists of a pair of NMOS transistors M3 and M4 for supplying a supply voltage Vcc to each of the input/output lines I/O and I/O, and a NMOS transistor M5 for connecting the pair of input/output lines I/O to and I/O each other. The three NMOS transistors M3, M4 and M5 are driven by an ATD pulse ATS supplied from an ATD circuit 40. Column address signals CA1~CA9 among address inputs XA0-XA9 are latched in the address buffer 50 by a column address strobe signal CAS. At this time the ATD circuit 40 detects the state transition of the column address signals add then generates the ATD pulse ATS having a predetermined pulse width. The conventional semiconductor memory device includes a column decoder circuit 60 to which the column address signals CA1-CA9 are supplied from the address buffer 50, in order to select a specific input/output gate circuit 20. In general, the column decoder circuit 60 uses an internally synchronizing CMOS circuit system, and therefore, it is constituted by a predecoder group 61 and a main decoder group 62 for promoting rapid access by reducing the number of elements and lowering gate load influencing on the address lines. The predecoder group 61 includes four predecoders 61A~61D respectively having four 2-bit column address signals (CA1, CA2), (CA3, CA4), (CA5, CA6) and (CA7, CA8) selected from the 8-bit column address input CA1~CA8; and a predecoder 61E having a 1-bit column address input signal CA9. Each of predecoders 61A~61D has four unit circuits A1-A4, and the predecoder 61E two. Main decoder group 62 comprises five main decoders 62A-62E respectively corresponding to predecoders 61A~61E, and decodes the outputs of the respective predecoders 61A~61E.

A unit circuit A1 of the predecoder 61A comprises two inverters INT 1 and INT 2 for respectively inverting the pair of column address inputs CA1 and CA2; a NAND gate NA 1 for combining outputs of the inverters INT1 and INT2; and inverter INT3 for inverting the output of the NAND gate NA1; a NAND gate NA2 and a NOR gate NR1 each having three inputs for forming a gate circuit in order to exclusively gate outputs of the inverter INT3 and other three combination signals (CA-1, CA-2), (CA-1, CA-2) and (CA-1, CA-2), and to disable the predecoder during the holding time of the ATD pulse ATS; and two inverters INT4 and INT5 for forming a buffer to generate a predecoder output DCA. (1,2) by buffering the output of the NAND gate NA2.

The constitution of the other unit circuits A2, A3 and A4 are formed similarly to that of the unit circuit A1 except for eliminating either one or both of the inverters INT1 and INT2 in the unit circuit A1, so as to feed the column address CA2 to the unit circuit A2, the column address CA1 to the unit circuit A3 and the column address CA1 and CA2 to the unit circuit A4 without inversion thereof.

Outputs of the unit circuits of each predecoder formed in the aforesaid manner are respectively supplied to each main decoder 62A~62E. The main decoder 62A consists of four NOR gates each having two inputs and a NAND gate NA3 having four inputs to exclusively gate the four predecoding signals (DCA1 . 2), (DCA1 . 2), (DCA1 . 2) and (DCA1 . 2) with respect to the other predecoding signals DCA(3,4), DCA(5,6), DCA(7,8) and DCA(9). The outputs CSL0~CSL3 of the NOR gates NR2~NR5 are respectively supplied to a corresponding input/output gate circuit. That is, main decoding signal CSLO is supplied to the input/output gate circuit 20, and turns on the pair of NMOS transistors M1 and M2.

In this manner, 512 decoders can be formed for 9-bit column address inputs CA1~CA9, at the maximum.

The column addressing operation of the device shown in FIG. 1 will now be explained with reference to FIG. 2, wherein the address signal XA is latched to the address buffer 50 at the trailing edge of the column address strobe selecting signal $\overline{CAS}$. The ATD circuit 40 detects the state transition of the column address signal latched to the address buffer 50, and then generates the ATD pulse ATS having a predetermined pulse width W. The ATD pulse ATS is supplied to the precharge circuit 30 and the inverted ATD pulse $\overline{ATS}$ is supplied to the predecoder 61. The three transistors M3~M5 of the precharge circuit 30 are turned on at the leading edge of the ATD pulse ATS and, successively, the supply voltage Vcc is applied to the pair of input/output lines I/O and I/O to be precharged. Further, the pair of input/output lines I/O and I/O are equalized by the transistor M5 to the voltage level of Vcc-VT, where the term VT is the threshold voltage of the NMOS transistor. On the other hand, the column address signal CA is held in a disable state by the inverted ATD pulse $\overline{ATS}$ applied to the NAND gate NA2 of the predecoder 61A, and is enabled at the trailing edge of the inverted ATD pulse $\overline{ATS}$ to generate the predecoding signal DCA. Successively, the main decoder 62A feeds the column selecting signal CSL to the input/output gate circuit 20. The input/output gate circuit 20 is turned on by the column selecting signal CSL. Therefore, the data bits "0" or "1" are transferred onto the pair of input/output lines I/O and I/O.

As described above, in the column addressing operation of the conventional semiconductor memory device, the column decoder means 60 is held in a disable state during the holding time of the ATD pulse, and is enabled to carry out the column decoding operation immediately after the precharging of the I/O lines is completed, as indicated by the trailing edge of the pulse ATS. Therefore, the column access time is delayed by the time of the width of the ATD pulse, thereby impeding high speed access.

Now, a semiconductor memory device according to the present invention will be described with reference to FIGS. 3 to 6.

Figure 3:
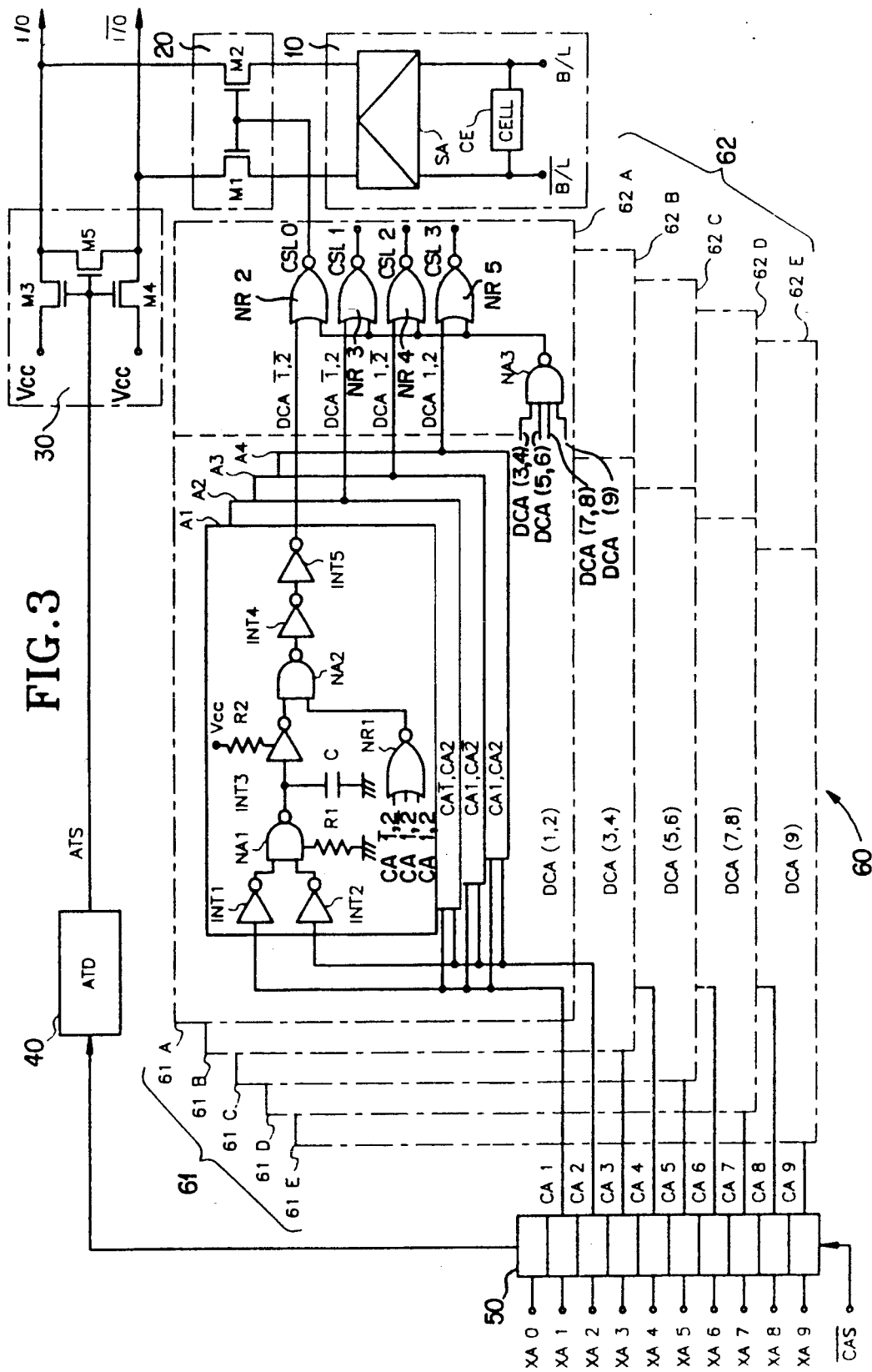
FIG. 3 is a circuit diagram of a column address circuit of a semiconductor memory device according to the present invention.

The device of the present invention shown in FIG. 3 is provided with a delay circuit added to the unit circuits of predecoder group 61 and eliminates the requirement of feeding the inverted ATD pulses to the predecoders. Other features are similar to those of the device shown in FIG. 1, thus the same numerals will be used hereinafter.

As shown in FIG. 3, the delay circuit according to the present invention includes a capacitor C connected between an output terminal of NAND gate NA1 and ground for endowing a predetermined delay characteristic to the unit predecoder circuits; a first resistor R1 connected between a ground terminal of the NAND gate NA1/ground for delaying the discharge time of the capacitor C; and a second resistor R2 connected between a power supply terminal of the inverter INT3 and a power source Vcc for delaying the rise of the output of the inverter INT3. The inverted ATD pulse $\overline{ATS}$ is not supplied to the NAND gate NA2 of the unit circuits.

Figure 4:
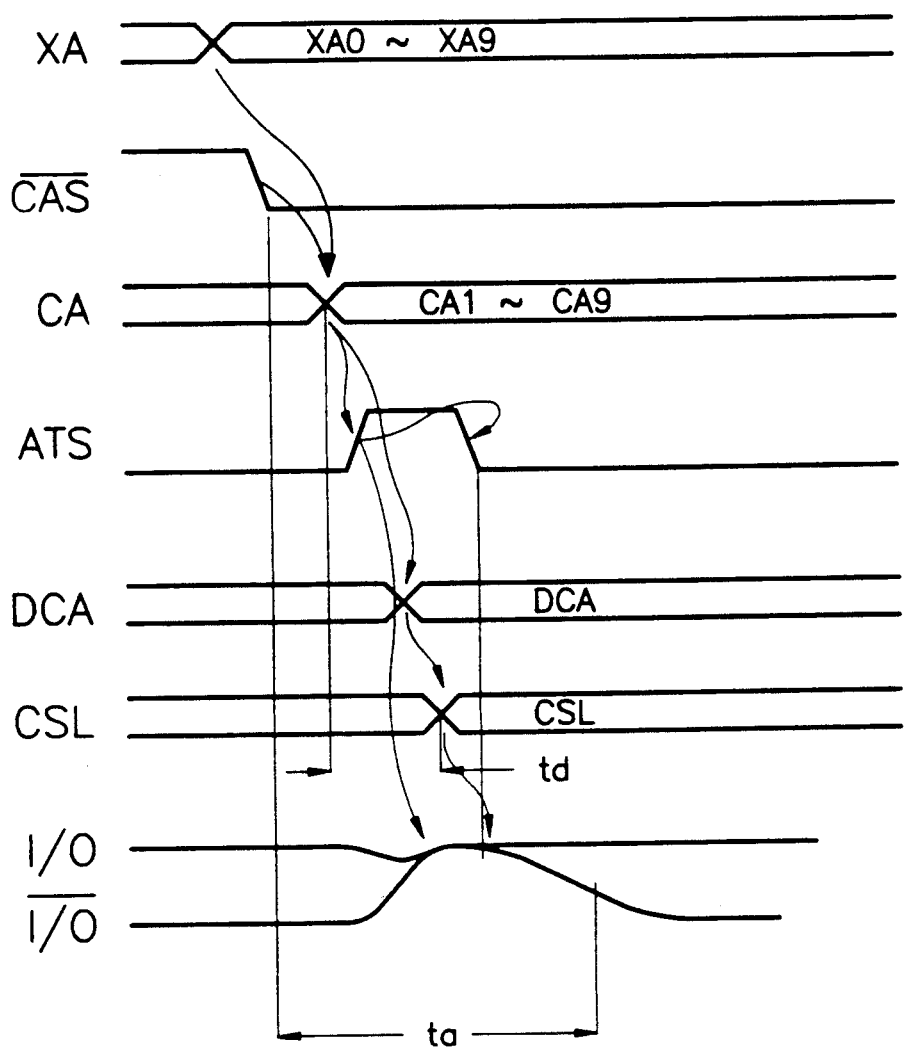
FIG. 4 is a timing chart for explaining the operation of the circuit shown in FIG. 3.

The column addressing operation of the above embodiment will be described in detail with reference to FIG. 4.

An address input signal is latched to an address buffer 50 at the trailing edge of an column address strobe signal $\overline{CAS}$. The ATD circuit 40 detects the state transition of the column address signal CA latched to the address buffer 50, then generates the ATD pulse ATS. As transistors M3~M5 of precharge circuit 30 are turned on at the leading edge of the ATD pulse ATS, a supply voltage Vcc is applied to the pair of input/output lines I/O and $\overline{I/O}$. The pair of lines I/O and $\overline{I/O}$ are precharged and equalized to the voltage level of Vcc-VT. The column address signal CA is supplied to predecoder 61A to be predecoded with the rise of the ATD pulse ATS, predecoding signal DCA, delayed for a predetermined time by the delay circuit C, R1, R2, is supplied to main decoder 62A, and a column selecting signal CSL is generated by the main decoder 62A to turn on the input/output gate circuit 20. The delay characteristic of the predecoder 61 is set to turn on the input/output gate circuit 20 immediately after the completion of precharge and equalization of the input/output lines I/O and $\overline{I/O}$ by the ATD pulse ATS. Thus, if the input/output gate circuit 20 is turned on with the ATD pulse being fed to the precharge circuit 30, the load capacity of the input/output lines is varied and, successively, the desired data are transferred onto the input/output lines I/O and $\overline{I/O}$ at the trailing edge of the ATD pulse ATS.

According to the present invention, the column decoding operation is performed independently of the ATD pulse ATS, thus the column decoding operation can be simultaneously completed with completion of the precharge of the input/output lines and equalization by properly adjusting the delay characteristic of the predecoder, as a result, the column access time ta can be drastically shortened to be about 10 ns, for example.

Figure 5:
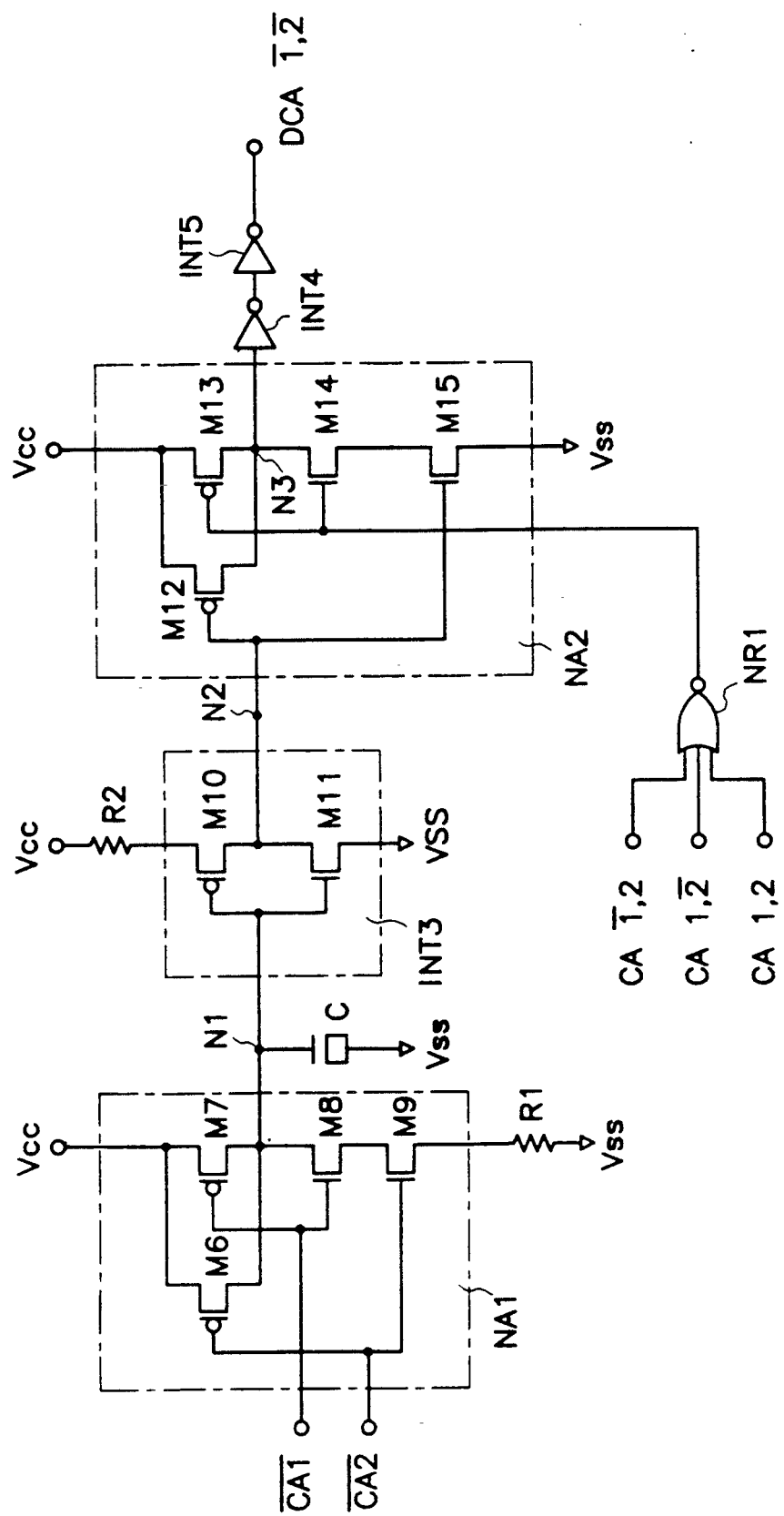
FIG. 5 is a detailed circuit diagram of a unit circuit of a predecoder shown in FIG. 3.

The signal delay characteristic of the predecoder will now be described in detail with reference to FIGS. 5 and 6.

The capacitor C is charged with the supply voltage Vcc by pull-up transistors M6 and M7 before the two column address signals CA1 and CA2 inputted to the 2-input NAND gate NA1 of the predecoder become high. When the two column address signals CA1 and CA2 are in a high state, pull-up transistors M6 and M7 are turned off, so that the charge stored in the capacitor C is discharged through the pull-down transistors M8 and M9 and the first resistor R1 to a ground Vss. Here, the discharge time constant depends on the value of the capacitor C and the resistor R1, if the turn-on resistance of the pull-down transistors M8 and M9 is ignored. Thus, the voltage level of node N1 is gradually decreased, according to the discharge time constant R1C. An inverter INT3 receiving the voltage signal of the node N1 is connected with the supply voltage Vcc through the second resistor R2, so that the output of the inverter INT3, i.e., the voltage level $VN_2$ of node N2 is gradually raised to the high state at the low state transition of the node voltage $VN_1$.

Figure 6:
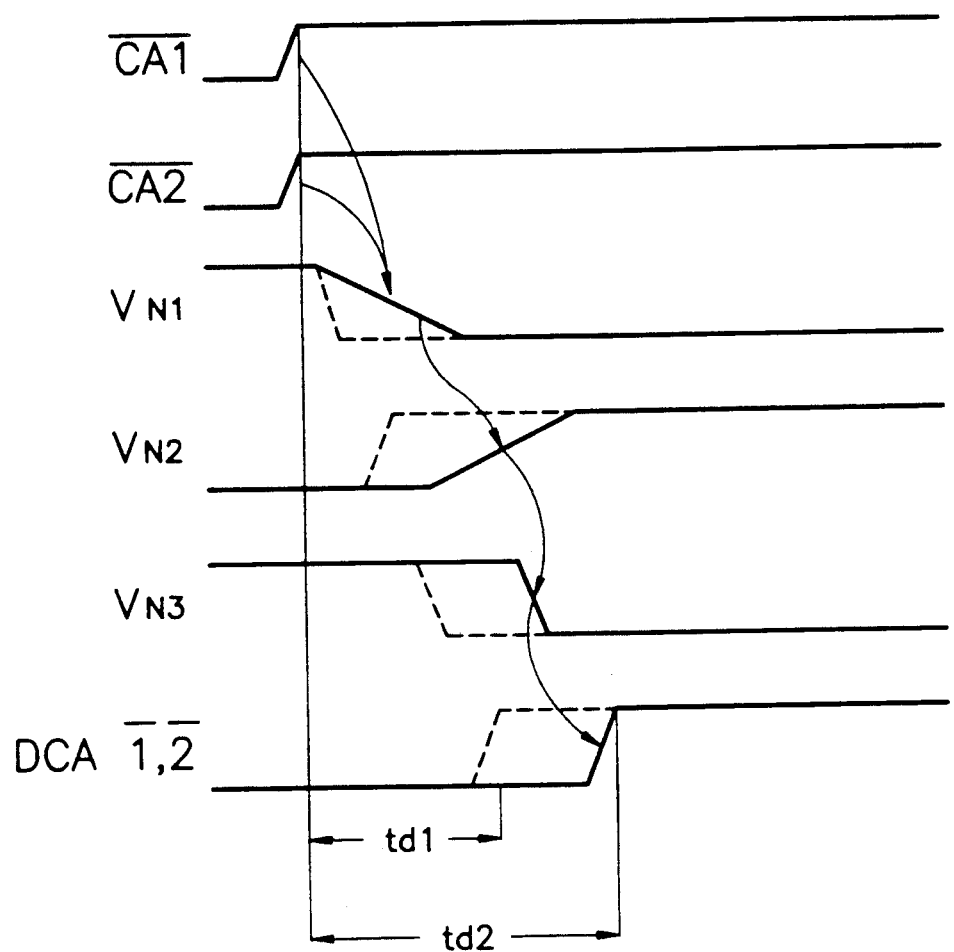
FIG. 6 is a timing chart for explaining the operation of the circuit shown in FIG. 5.

The node voltage $VN_3$ of the output node N3 of the NAND gate NA2 indicated by the solid line wave pattern of FIG. 6 is delayed for a predetermined time than that indicated by the dotted line as shown in FIG. 6. Therefore, a predecoding signal DCA1 . 2 has longer delay time $td_2$ than the conventional delay time $td_1$. The delay time $td_2$ can be optimized by adjusting the resistance of the second resistor R2.

According to the present invention, the total decoding time of the column decoder circuit 60 is matched to turn on the input/output gate circuit 20 immediately after the completion of precharging and equalizing of the input/output lines, by delaying the predecoding time for a predetermined time by means of the capacitor C and the resistors R1 and R2, so that the column address selection can be carried out independently of the ATD pulse. Therefore, the NAND gate NA2 of the unit circuits of the predecoder can be formed by a 2-input gate as opposed to the 3-input gate of the prior art. As a result, the number of transistors can be decreased by two for each gate and the wiring of the inverted ATD pulse between the ATD circuit and the predecoder can be eliminated. This makes it possible to obtain a simplified circuit design, reduce the manufacturing cost and shorten the desired column access time, thereby achieving high speed access.

Although the invention has been shown and described by a specific form in which a delay circuit is adopted by the predecoder, it should be noted that many changes and modifications will be obvious to one skilled in the art without departing from the true spirit and scope of the invention as defined in the appended claims.

What is claimed is:

1. A semiconductor memory device, comprising:
    address transition detection means for detecting a state transition of a memory address signal and generating an address transition state pulse having a predetermined pulse width;
    precharge means for precharging and equalizing a pair of input/output lines in response to said address transition state pulse;
    address decoder means for decoding said memory address signal and generating an address selection signal, including delay means for delaying the decoding of said memory address signal by a predetermined amount of time from said state transition independent from said address transition state pulse, such that said address selection signal is outputted immediately upon completion of precharging and equalizing said input/output lines; and
    gate means operatively coupled to said address selection signal for connecting said pair of input/output lines to a pair of bit lines of a memory location corresponding to said address selection signal.

2. A semiconductor memory device according to claim 1, wherein said address decoder means comprises a predecoder section and a main decoder section, said delay means being provided in said predecoder section.

3. A semiconductor memory device according to claim 2, wherein said memory address signal is a multi-bit signal, and said predecoder section comprises:

NAND gate means for outputting signals corresponding to predetermined combinations of subsets of said multibit signal; inverter means for inverting the outputs of said NAND gate means;

exclusive combinational gate means for exclusively gating one combination for each of said subsets of said multibit signal as said address selection signal;

said delay means being coupled to said NAND gate means and said inverter means for delaying the outputs thereof by a total time corresponding to said predetermined amount of time.

4. A semiconductor memory device as claimed in claim 3 wherein said delay means comprises:

a capacitor connected between an output terminal of said NAND gate means and ground;

a first resistor connected between a ground terminal of said NAND gate means and ground for delaying the discharging time of said capacitor; and a second resistor connected between a supply voltage terminal of said inverter means and a power source for delaying the rise of the output of said inverter means.

5. A semiconductor memory device as claimed in claim 4 wherein said delay means adjusts the delay time by varying the resistance of said second resistor.

* * * * *